United States Patent
Dezelah et al.

(10) Patent No.: US 12,394,634 B2
(45) Date of Patent: Aug. 19, 2025

(54) ETCH PROCESS AND A PROCESSING ASSEMBLY

(71) Applicant: ASM IP Holding, B.V., Almere (NL)

(72) Inventors: Charles Dezelah, Helsinki (FI); Viljami Pore, Helsinki (FI); Varun Sharma, Helsinki (FI)

(73) Assignee: ASM IP Holding, B.V., Almere (NL)

( * ) Notice: Subject to any disclaimer, the term of this patent is extended or adjusted under 35 U.S.C. 154(b) by 231 days.

(21) Appl. No.: 18/056,169

(22) Filed: Nov. 16, 2022

(65) Prior Publication Data
US 2023/0170221 A1 Jun. 1, 2023

Related U.S. Application Data

(60) Provisional application No. 63/282,825, filed on Nov. 24, 2021.

(51) Int. Cl.
*H01L 21/3213* (2006.01)
*H01L 21/306* (2006.01)
*H01L 21/311* (2006.01)

(52) U.S. Cl.
CPC .. *H01L 21/32135* (2013.01); *H01L 21/30621* (2013.01); *H01L 21/31116* (2013.01); *H01L 21/31138* (2013.01)

(58) Field of Classification Search
CPC ................................................. H01L 21/00–86
See application file for complete search history.

(56) References Cited

U.S. PATENT DOCUMENTS

| 2011/0056515 | A1  | 3/2011 | Mitchell |
| 2021/0098262 | A1* | 4/2021 | Young .............. H01L 21/02178 |
| 2021/0175088 | A1* | 6/2021 | Dezelah .................... C23F 1/12 |

FOREIGN PATENT DOCUMENTS

| WO | WO-2007035460 A1 * | 3/2007 | ............. C03C 15/00 |
| WO | WO-2021202411 A1 * | 10/2021 | ......... H01L 21/3065 |

OTHER PUBLICATIONS

Petrov et al., 1, 1,2,2-Tetrafluoroethul-N.N-dimethylamine: a new selective fluorinating agent, J. Fluorine Chem. 109 (2001) 25-31.
Hayashi et al., 2,2-Difluoro-1,3-dimethylimidazolidine (DFI). A new fluorinating agent, Chem. Comm. (2002) 1618-1619.
J. S. Thrasher et al., An Improved Synthesis of Dichlorofluoramine, FNCl2, J. Fluorine Chemistry, 52 (1991) 51-55.
C. M. Sharts, N, N-Difluoroalkylamines by Direct Fluorination of Alkylamines, J. Organic Chemistry, 33(3), 1008, (1968).
(Continued)

*Primary Examiner* — Joshua L Allen
*Assistant Examiner* — Andrew Keelan Laobak
(74) *Attorney, Agent, or Firm* — Banner & Witcoff, Ltd.

(57) ABSTRACT

The current disclosure relates to a method of etching etchable material from a semiconductor substrate. The method comprises providing a substrate comprising the etchable material into a reaction chamber and providing a haloalkylamine into the reaction chamber in vapor phase for etching the etchable material. The disclosure further relates to a semiconductor processing assembly, and to a method of cleaning a reaction chamber.

20 Claims, 3 Drawing Sheets

(56) References Cited

OTHER PUBLICATIONS

Om Dutt Gupta et al, Reactions of Trifluoroamine Oxide: A Route to Acyclic and Cyclic Fluoroamines and N-Nitrosoamines, J. Am. Chem. Soc. 1990, 112, 2383-2386.
K. Hagen et al, Structure and Vibrational Force Field of Methyldifluoroamine, CH3NF2. An Electron-Diffraction Investigation Augmented by Microwave and Infrared Spectroscopic Data and by Ab Initio Molecular Orbital Calculations, J. Phys. Chem. A 1998, 102, 5106-5110.
R. P. Singh et al., The first application of Selectfluor™ in electrophilic fluorination of amines: a new route to -NF2, -NHF, and > NF compounds, The Royal Society of Chemistry 2001, Chem. Commun., 2001, 1196-1197.
R. A. Wiesboeck, The Preparation of N,N-Difluoroalkylamines by Aqueous Flouorination, Tetrahadron, vol. 26, pp. 837 to 840, Pergamon Press 1970.
R. M. Badger, The Relation Between the Internuclear Distances and Force Constants of Molecules and Its Application to Polyatomic Molecules, J. Chemical Physics 3, 710 (1935).

\* cited by examiner

ETCH PROCESS AND A PROCESSING ASSEMBLY

CROSS REFERENCE TO RELATED APPLICATIONS

This Application claims the benefit of U.S. Provisional Application 63/282,825 filed on Nov. 24, 2021, the contents of which are incorporated herein by reference in their entirety.

FIELD

The present disclosure relates to methods and apparatuses for the manufacture of semiconductor devices. More particularly, the disclosure relates to methods and semiconductor processing assemblies for selective etching of different materials.

BACKGROUND

The manufacture of semiconductor devices relies on the precise formation of material layers with a controlled thickness and surface structure. To obtain such materials, etching of selected materials and/or portions thereof may be performed.

Dry etch methods generally rely on plasma-based or non-plasma-based methods. In non-plasma methods, chemistries are used that react with surface compositions to produce gaseous reaction products. The reaction products are removed from the substrate surface, leading to etching of the surface material in question. Methods such as chemical vapor etch (CVE) and atomic layer etching (ALEt) have received increasing attention in recent years due to a wide variety of potential applications in the semiconductor industry. Non-plasma-based dry etch methods typically require highly corrosive and dangerous chemicals, such as the use of hydrogen fluoride (HF) or molecules that generate or are chemically similar to HF. These approaches, however, may pose significant environmental, health, and safety concerns, due to inherent hazards associated with HF use. Additionally, such methods typically require a co-reactant or catalyst, such as ammonia ($NH_3$), which can leave a residue on the surface. Prior-art processes may also damage underlaying material layers, and the etching may be aspect-ratio dependent. Thus, there is need in the art for further development and fine-tuning of etch processes to enable safer etch processes, while allowing for further scalability and versatility in semiconductor device manufacture.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter. Various embodiments of the present disclosure relate to methods of etching a material from a substrate and to semiconductor processing assemblies for etching material from a substrate.

In one aspect, a method of etching etchable material from a semiconductor substrate is disclosed. The method comprises providing a substrate comprising the etchable material into a reaction chamber and providing a haloalkylamine into the reaction chamber in vapor phase for etching the etchable material. The haloalkylamine according to the current disclosure comprises a carbon atom bonded to a nitrogen atom and to at least one halogen atom. In some embodiments, the carbon atom is bonded to two halogen atoms.

In some embodiments, the method comprises providing a second reactant into the reaction chamber. In some embodiments, the second reactant is an oxygen-containing reactant selected from a group consisting of $O_2$, $O_3$, $H_2O_2$ and carboxylic acids. In some embodiments, the second reactant is molecular oxygen. In some embodiments, the second reactant is ozone. In some embodiments, the second reactant is hydrogen peroxide. In some embodiments, the second reactant is formic acid.

In some embodiments, the second reactant is a halide. In some embodiments, the halide is a metalloid halide. In some embodiments, the halide is a metal halide. In some embodiments, the halide is selected from a group consisting of $BCl_3$, $SiCl_4$, and $TiCl_4$. In some embodiments, the halide is $BCl_3$. In some embodiments, the halide is $SiCl_4$. In some embodiments, the halide is $TiCl_4$.

In some embodiments, the second reactant is an organometallic compound. In some embodiments, the organometallic compound is an alkylaluminum compound. In some embodiments, the second reactant comprises a halogenated sulfur compound. In some embodiments, the halogenated sulfur compound comprises a sulfinyl group. In some embodiments, the halogenated sulfur compound comprises a sulfuryl group.

In some embodiments, the method is a cyclic etch method. In some embodiments, the method is a self-limiting process. In some embodiments, providing a haloalkylamine and the second reactant into the reaction chamber are performed alternately and sequentially. In some embodiments, the method does not include a step of forming a plasma. Thus, in some embodiments, the method according to the current disclosure is a plasma-free etch process. In some embodiments, the method does not include providing HF into a reaction chamber.

In some embodiments, the etchable material comprises a metal. In some embodiments, the etchable material comprises a metal oxide or metal nitride. In some embodiments, the etchable material comprises silicon or germanium.

In some embodiments, the method according to the current disclosure is a selective etching method. In some embodiments, the substrate comprises a first surface and a second surface, and the first surface is selectively etched relative to the second surface.

In another aspect, a method of etching etchable material from a semiconductor substrate is disclosed. The method comprises providing a substrate comprising the etchable material into a reaction chamber and providing a haloalkylamine into the reaction chamber in vapor phase for etching the etchable material. The haloalkylamine according to this aspect comprises a carbon atom bonded to a nitrogen atom, wherein the nitrogen atom is bonded to at least one halogen atom. In some embodiments, the nitrogen atom is bonded to two halogen atoms. In some embodiments, the nitrogen atom is bonded to two carbon atoms and one halogen atom. In some embodiments, the one or two halogen atoms are fluorine. In some embodiments, the haloalkylamine is N-fluoro-N-(1-methylethyl)-2-propanamine. In some embodiments, the haloalkylamine is selected from a group consisting of N-fluoro-N-(1-methylethyl)-2-propanamine, N-fluoro-N-methylmethanamine, N-fluoro-N-ethylethanamine, N-fluoro-N-propyl-1-propanamine, N,N-difluoromethanamine, N,N-difluoroethanamine, N,N-difluoro-1-propanamine.

In an aspect, an atomic layer etching (ALEt) method of etching etchable material from a semiconductor substrate is disclosed. The method comprises providing a substrate comprising the etchable material into a reaction chamber, providing a haloalkylamine into the reaction chamber in a vapor phase and providing a second reactant into the reaction chamber in a vapor phase to etch about a monolayer of the etchable material from the substrate. The haloalkylamine according to the current disclosure comprises a carbon atom bonded to a nitrogen atom and to at least one halogen atom. In some embodiments of the ALEt method according to the current disclosure, the second reactant is an oxygen-containing reactant selected from a group consisting of $O_2$, $O_3$, $H_2O_2$ and carboxylic acids.

In another aspect, a semiconductor processing assembly for etching material from a surface of a substrate is disclosed. The processing assembly according to the current disclosure comprises one or more reaction chambers constructed and arranged to hold the substrate, an injector system constructed and arranged to provide a haloalkylamine into the reaction chamber in a vapor phase and a first reactant vessel constructed and arranged to contain the haloalkylamine, wherein the haloalkylamine comprises a carbon atom bonded to a nitrogen atom and to at least one halogen atom. The processing assembly is constructed and arranged to provide the haloalkylamine via the injector system into the reaction chamber for etching the material from the substrate. In some embodiments, the semiconductor processing assembly further comprises a second reactant vessel constructed and arranged to contain a second reactant and the injector system is constructed and arranged to provide the second reactant into the reaction chamber in a vapor phase. In some embodiments, the injector system is constructed and arranged to provide the haloalkylamine and the second reactant into the reaction chamber alternately.

In yet another aspect, a method of cleaning a reaction chamber of a semiconductor processing assembly is disclosed. The method comprises providing a reaction chamber having an inner surface and providing a haloalkylamine into the reaction chamber to remove material deposited on the inner surface, wherein the haloalkylamine comprises a carbon atom bonded to a nitrogen atom and to at least one halogen atom. In some embodiments of the method of cleaning a reaction chamber, the temperature of the reaction chamber is from about 100° C. to about 600° C. In some embodiments, the method of cleaning a reaction chamber comprises providing a second reactant into the reaction chamber, and wherein the second reactant is selected from a group consisting of $O_2$, $O_3$, $H_2O_2$.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings.

DETAILED DESCRIPTION

Figure 1A:
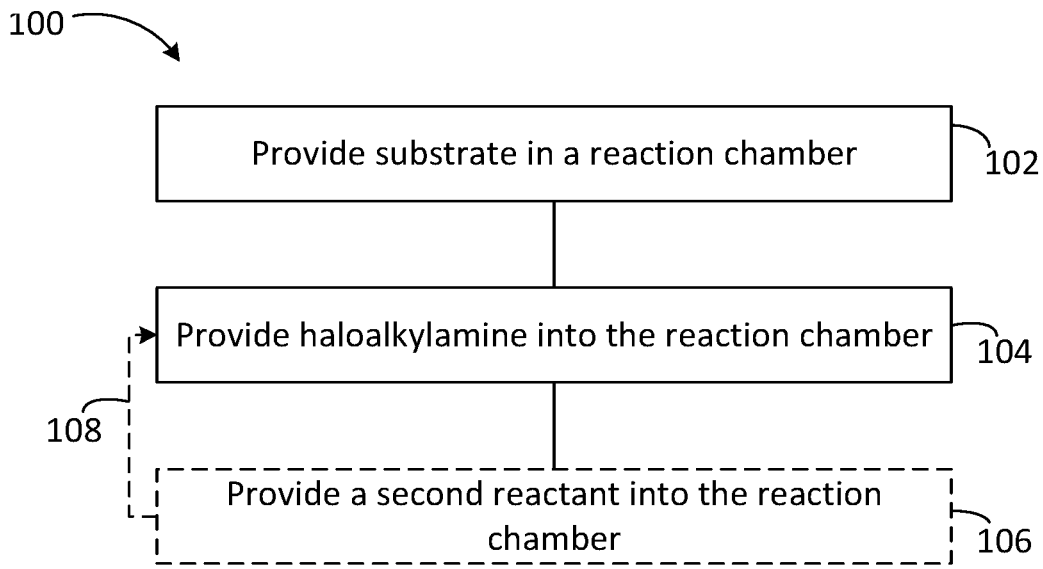
FIGS. 1A and 1B present exemplary embodiments of a method according to the current disclosure as a flow chart.

The description of exemplary embodiments of methods and semiconductor processing assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

In the current disclosure, methods using halogenated amines, such as fluorinated amines, as an etchant for various materials, such as metals, metal oxides, and metal nitrides are presented. The approach is plasma-free and avoids many of the drawbacks associated with methods known in the art. Exemplary embodiments of the current disclosure can be used to manufacture electronic devices, such as memory and/or logic circuits. More specifically, the embodiments of the current disclosure may be used to etch layers used, for example, in a wide variety of semiconductor devices, including CMOS, DRAM, flash, and magnetic head applications. Silicon-based materials, such as silicon oxide, silicon nitride, as well as metal oxides, have many suitable properties for use in semiconductor applications, and may be etched by methods according to the current disclosure.

Various embodiments of the current disclosure relate to a method of etching etchable material from a semiconductor substrate. The etching is performed by vapor/gas-phases etchant, and by an optional vapor/gas-phase second reactant. In this disclosure, "gas" can include material that is a gas at normal temperature and pressure (NTP), a vaporized solid and/or a vaporized liquid, and can be constituted by a single gas or a mixture of gases, depending on the context. The second reactant may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas As used herein, the term "substrate" may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers. In some embodiments, a substrate according to the current disclosure comprises two surfaces having different material properties, and the material on the first surface is etchable material.

Etchable Material

Etchable material according to the current disclosure is material that can be etched by haloalkylamines described herein. Examples of etchable materials according to the current disclosure are oxides. In some embodiments, etchable material is a metalloid oxide, such as silicon oxide or germanium oxide. In some embodiments, the etchable material is a dielectric material. In some embodiments, the etchable material is a low-k material. In some embodiments, the etchable material comprises an oxide. In some embodiments, the etchable material is a nitride, such as silicon nitride.

In some embodiments, the etchable material comprises silicon or germanium. In some embodiments, the etchable material comprises silicon. Examples of silicon-comprising etchable materials include silicon oxide-based materials, including grown or deposited silicon dioxide, doped and/or porous oxides and native oxide on silicon. In some embodiments, the etchable material is silicon oxide. In some embodiments, the etchable material is a silicon oxide surface, such as a native oxide surface, a thermal oxide surface or a chemical oxide surface. In some embodiments, the etchable material is SiN. In some embodiments, the etchable material comprises SiOC. In some embodiments, the etchable material comprises metal silicates, such as aluminum silicate. Thus, the etchable material may be any of silicon oxide, SiN, SiOC or a metal silicate. In some embodiments, silicon oxide is etched by providing a haloalkylamine, such as an α-fluoroalkylamine, according to the current disclosure as the only etchant into the reaction chamber. In some embodiments, silicon oxide is etched by providing N,N-diethyl-1,1,2,3,3,3-hexafluoro-1-propanamine into the reaction chamber in vapor phase. In some embodiments, silicon oxide is etched by providing 2,2-difluoro-1,3,-dimethylimidazolidine into the reaction chamber in vapor phase. In some embodiments, silicon oxide is etched by providing 1,1,2,2,-tetrafluoroethyl-N,N-dimethylamine into the reaction chamber in vapor phase. In some embodiments, providing N,N-diethyl-1,1,2,3,3,3-hexafluoro-1-propanamine alone (i.e. in the absence of other etchants) into the reaction chamber in vapor phase does not etch silicon nitride. In some embodiments, providing 2,2-difluoro-1,3,-dimethylimidazolidine alone into the reaction chamber in vapor phase does not etch silicon nitride. In some embodiments, providing 1,1,2,2,-tetrafluoroethyl-N,N-dimethylamine alone into the reaction chamber in vapor phase does not etch silicon nitride. The etching specificity may depend on process conditions, such as temperature, the deposition conditions of the etchable material, and the identity of the etchant.

In some embodiments, a material layer is etched by the process according to the current disclosure. As used herein, the term "layer" and/or "film" can refer to any continuous or non-continuous structure and material. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. In some embodiments, etchable material is present as nuclei on a substrate surface. For example, the etchable material may be parasitically grown material on an unwanted surface.

In some embodiments, the etchable material comprises a metal oxide or metal nitride. In some embodiments, the etchable material is a metal oxide. In some embodiments, the etchable material is a transition metal oxide or a mixture of two or more transition metal oxides. In some embodiments, the etchable material is aluminum oxide. In some embodiments, the etchable material is zirconium oxide, hafnium oxide or lanthanum oxide. In some embodiments, the etchable material is tungsten oxide or titanium oxide. In some embodiments, a metal oxide surface is an oxidized surface of a metallic material. In some embodiments, a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments, a metal oxide surface is a native oxide formed on a metallic material.

In some embodiments, the etchable material comprises hydroxyl (—OH) groups.

In some embodiments, the etchable material comprises a metal. In some embodiments, the etchable material is a metal. In some embodiments, the etchable material is tungsten (W). In some embodiments, the etchable material comprises, consists essentially of, or consists of a group 5 metal, such as vanadium, niobium or tantalum. In some embodiments, the etchable material comprises, consists essentially of, or consists of a group 6 metal, such as chromium, molybdenum or tungsten.

In some embodiments, the etchable material comprises one or more of silicon oxide, silicon nitride, germanium oxide, titanium nitride, titanium oxide, aluminum oxide, zirconium oxide, aluminum nitride, tungsten, copper, copper oxide, cobalt, cobalt oxide, molybdenum, molybdenum oxide, ruthenium, ruthenium oxide or hafnium oxide.

In some embodiments, the haloalkylamines according to the current disclosure may be used to clean silicon-containing surfaces, such as silicon dioxide surfaces prior to epitaxial growth. In such embodiments, selective etching may be advantageous. The disclosed haloalkylamines may further be used in removing accumulated materials from reaction chamber surfaces.

Haloalkylamine

In the current disclosure, etching a material from a semiconductor substrate comprises providing a haloalkylamine, such as α-fluoroalkylamine, into a reaction chamber containing the substrate. Haloalkylamine according to the current disclosure comprises a carbon atom bonded to a nitrogen atom and to at least one halogen atom. In some embodiments, a haloalkylamine according to the current disclosure is an α-haloalkylamine, such as an α-fluoroalkylamine. In α-haloalkylamines, the halogen is bonded to the same carbon (the α carbon) as the amine group. In some embodiments, the amine is a tertiary amine. Without limiting the current disclosure to any specific theory, a tertiary amine may have advantages in displaying preferential activity of the halogen group over the amine group. In some embodiments, the amine of the haloalkylamine according to the current disclosure may be a secondary amine, or a primary amine.

Thus, the structure of an etchant according to the current disclosure contains a C—N—X fragment, where X depicts a halogen. In some embodiments, the C—N—X fragment according to the current disclosure may be represented by formula (I)

(I)

In some embodiments, the N—C—X fragment may be represented by formula (II)

(II)

In the formulas (I) and (II), each R may be independently selected from C1-C6 hydrocarbons, such as methyl, ethyl, propyl, isopropyl, butyl and pentyl. In some embodiments, the carbon of the N—C—X fragment is bonded to an additional hydrocarbon, as illustrated by R' in formulas (III) and (IV). In some embodiments, one or both R may be H. In the current disclosure, a butyl group may be selected from n-butyl, sec-butyl, isobutyl and tert-butyl. In the current disclosure, a pentyl group may be selected from n-pentyl, tert-pentyl, neopentyl, isopentyl, sec-pentyl, 3-pentyl and sec-isopentyl.

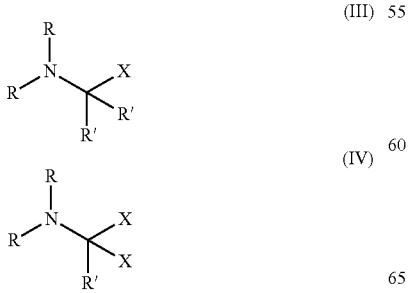

(III)

(IV)

In formulas (III) and (IV), R' may be selected from C1-C6 hydrocarbons, partially fluorinated C1-C6 hydrocarbons, C1-C6 perfluoroalkyl groups, aryl groups that include 0-5 fluorine atoms and 0-5 alkyl groups, and from $CF_3$ or a derivatives thereof, and from —NR''$_2$ groups, where R'' is selected from C1-C6 hydrocarbons, partially fluorinated C1-C6 hydrocarbons, C1-C6 perfluoroalkyl groups, aryl groups that include 0-5 fluorine atoms and 0-5 alkyl groups, or $CF_3$ or derivatives thereof and —NR'''$_2$ groups, where R''' can be selected from C1-C6 hydrocarbons. This is illustrated by the formulas (V) and (VI), in which R'' and R''' are depicted, respectively.

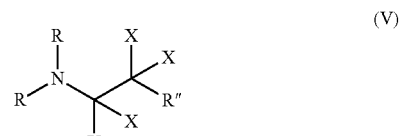

(V)

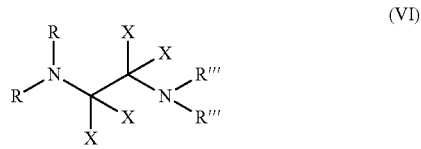

(VI)

As indicated above, in some embodiments, the N—C—X carbon atom is bonded to two halogen atoms. Generally, in addition to the α carbon, also a β carbon may be bonded to one or more halogens, such as fluorine.

In some embodiments, the haloalkylamine comprises two carbon atoms each bonded to a nitrogen atom and to at least one halogen atom. In some embodiments, the haloalkylamine comprises two carbon atoms each bonded to a nitrogen atom and to one halogen atom. In some embodiments, the haloalkylamine comprises two carbon atoms each bonded to a nitrogen atom and to two halogen atoms. Exemplary structures of such haloalkylamines are depicted in formulas (VII) and (VIII). The two carbon atoms of the N—C—X fragment may be adjacent carbon atoms as in the exemplary structures (VII) and (VIII). However, there may be one or more carbon atoms between the N—C—X carbons.

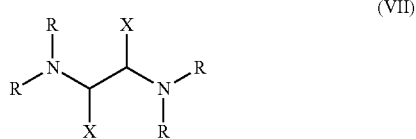

(VII)

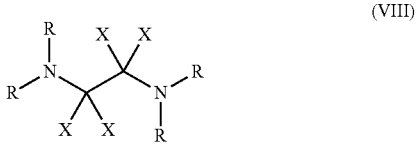

(VIII)

In some embodiments, the at least one halogen atom is selected from a group consisting of fluorine (F), bromine (Br) and chlorine (Cl). In some embodiments, the halogen atom is F. In some embodiments, the carbon atom is bonded to two F atoms. In some embodiments, all of the halogens in a haloalkylamine according to the current disclosure are fluorine atoms. In some embodiments, all of the halogens in a haloalkylamine according to the current disclosure are chlorine atoms.

In some embodiments, the haloalkylamine comprises a compound represented by the formula $R_2NCF_2R'$, wherein each R is independently selected from C1-C6 hydrocarbons and R' is selected from C1-C6 hydrocarbons, a partially fluorinated C1-C6 hydrocarbons, C1-C6 perfluoroalkyl groups, aryl groups that include 0-5 fluorine atoms and 0-5 alkyl groups, or $CF_3$ or derivatives thereof, and $—NR''_2$ groups, where R" is selected from C1-C6 hydrocarbons, partially fluorinated C1-C6 hydrocarbons, C1-C6 perfluoroalkyl groups, aryl groups that include 0-5 fluorine atoms and 0-5 alkyl groups, or $CF_3$ or derivatives thereof and $—NR'''_2$ groups, where R''' can be selected from C1-C6 hydrocarbons. In some embodiments, each of R, R', R" and R''' may be independently an H.

In some embodiments, one or more of R and R' comprises a cyclic group. Formula (IX) depicts an exemplary embodiment of a haloalkylamine according to the current disclosure comprising a cyclic R group. Formula (X) depicts an exemplary embodiment of a haloalkylamine according to the current disclosure comprising a cyclic R' group.

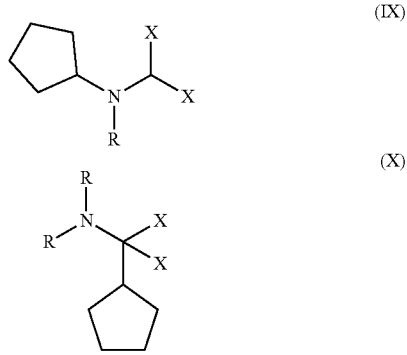

In some embodiments, the cyclic group comprises an $N—C—F_2$ fragment.

In some embodiments, the alkylamine is 1,1,2,2,-tetrafluoroethyl-N,N-dimethylamine. In some embodiments, the alkylamine is 2,2-difluoro-1,3-dimethylimidazolidine. In some embodiments, the alkylamine is N,N-diethyl-1,1,2,3,3,3-hexafluoro-1-propanamine. In some embodiments, the alkylamine is 2-chloro-N,N-diethyl-1,1,2-trifluoroethanamine.

In some aspects of the disclosure, the haloalkylamine comprises a carbon atom bonded to a nitrogen atom, wherein the nitrogen atom is bonded to at least one halogen atom. In some embodiments, the nitrogen atom is bonded to two halogen atoms and one carbon atom. In some embodiments, the nitrogen atom is bonded to two carbon atoms and one halogen atom. In some embodiments, the nitrogen atom is bonded to one carbon atom and one halogen atom. In some embodiments, the haloalkylamine has a formula $R_yNX_{3-y}$, wherein X is halogen and y is 1 or 2, and wherein each R is independently selected from branched, linear or cyclic C1 to C14 hydrocarbons. The total number of carbons is typically 15 at maximum, to ascertain sufficient volatility of the haloalkylamine. In some embodiments, the haloalkylamine comprises 10 carbon atoms at most. In some embodiments, the haloalkylamine comprises 8 carbon atoms. In some embodiments, the haloalkylamine comprises 7 carbon atoms. In some embodiments, the haloalkylamine comprises 6 carbon atoms. In some embodiments, the haloalkylamine comprises 5 carbon atoms. In some embodiments, the haloalkylamine comprises 4 carbon atoms. In some embodiments, the haloalkylamine comprises 3 carbon atoms. In some embodiments, the haloalkylamine comprises 2 carbon atoms.

In some embodiments, the one or two halogen atoms are fluorine. In some embodiments, the haloalkylamine is N-fluoro-N-(1-methylethyl)-2-propanamine. In some embodiments, the haloalkylamine comprises two nitrogen atoms bonded to a halogen, such as fluorine. The two nitrogen atoms may be bonded to the same carbon atom or different carbon atoms. In some embodiments, the haloalkylamine is selected from a group consisting of N-fluoro-N-(1-methylethyl)-2-propanamine, N-fluoro-N-methylmethanamine, N-fluoro-N-ethylethanamine, N-fluoro-N-propyl-1-propanamine, N,N-difluoromethanamine, N,N-difluoroethanamine, N,N-difluoro-1-propanamine. Without limiting the current disclosure to any specific theory, using a fluoroalkylamine may offer advantages in etching semiconductor materials, such as silicon-based materials, for example $SiO_2$. The current haloalkylamines may, for example, halogenate materials directly, or through in-situ generated $NF_3$. The process may be controlled by the reaction chamber temperature, which may, be, for example from about 200° C. to about 300° C., such as about 250° C.

Second Reactant

In some embodiments, the method comprises providing a second reactant into the reaction chamber. As used herein, the term "reactant" can refer to one or more gases or vapors that take part in a chemical reaction or from which a gas-phase substance that takes part in a reaction is derived. The chemical reaction can take place in the gas phase and/or between a gas phase and a surface (e.g., of a surface of a substrate) and/or a species on the surface.

In some embodiments, the second reactant is an oxygen-containing reactant selected from a group consisting of $O_2$, $O_3$, $H_2O_2$ and carboxylic acids. In some embodiments, the second reactant is molecular oxygen. In some embodiments, the second reactant is ozone. In some embodiments, the second reactant is hydrogen peroxide. In some embodiments, the second reactant is formic acid.

In some embodiments, the second reactant is a halide. In some embodiments, the halide is a metalloid halide. In some embodiments, the halide is a metal halide. In some embodiments, the halide is selected from a group consisting of $BCl_3$, $SiCl_4$, and $TiCl_4$. In some embodiments, the halide is $BCl_3$. In some embodiments, the halide is $SiCl_4$. In some embodiments, the halide is $TiCl_4$.

In some embodiments, the second reactant is an organometallic compound. In some embodiments, the organometallic compound is an alkylaluminum compound. In some embodiments, the organometallic compound is trimethylaluminum ($Al(CH_3)_3$) or dimethylaluminum chloride ($AlCl(CH_3)_2$). In some embodiments, the organometallic compound is trimethylaluminum ($Al(CH_3)_3$). In some embodiments, the organometallic compound is dimethylaluminum chloride ($AlCl(CH_3)_2$). In some embodiments, the second reactant is a metal-β-diketonate. For example, the β-diketonate may be acetylacetone (acac) or hexafluoroacetylacetone (hfac). The metal may be tin. In some embodiments, the second reactant is $Sn(acac)_2$.

In some embodiments, the second reactant is selected from one or more of the group consisting of water; a C1-C6 alcohol; ammonia; a C1-C6 primary, a secondary, or tertiary amine; a C1-C6 carboxylic acid; and a C1-C6 alkyl hydrazine. In some embodiments, the second reactant is an alkyl aluminum compound, such as trimethyl aluminum or dimethyl aluminum chloride. In some embodiments, halides such as boron trichloride, silicon tetrachloride and titanium tetrachloride are used as the second reactant. In some embodiments, an oxygen-containing compound, such as $H_2O$, $O_2$, $O_3$ or $H_2O_2$ is used as the second reactant.

In some embodiments, the second reactant comprises a halogenated sulfur compound. In some embodiments, the halogenated sulfur compound comprises a sulfinyl group. In some embodiments, the halogenated sulfur compound is thionyl chloride (dichlorosulfoxide). In some embodiments, the halogenated sulfur compound comprises a sulfuryl group. In some embodiments, the halogenated sulfur compound comprises: sulfuryl fluoride, sulfuryl chloride, sulfonyl halide R—S($O_2$)—X, wherein R is selected from C1-C6 alkyls, disulfuryl fluoride FS($O_2$)—O—S($O_2$)F and disulfonyl chloride.

Exemplary halogenated sulfur compounds include compounds represented by the formula $S_aX_b$ where S is sulfur and each X is independently one of F, Cl, Br, or I, where a is a value from 1 to 3, and where b is a value from 2 to 14, it being understood that b is selected to be within a workable range based on the value of a. In accordance with examples of the disclosure, at least one X is F. In some embodiments, each X is F.

In some cases, the halogenated sulfur compound includes sulfur, oxygen, and one or more halogens. In such embodiments, the halogenated sulfur compound can be represented by the formula $S_aX_bO_c$, where S is sulfur, O is oxygen, X is independently F, Cl, Br, I, OH, or an alkyl group containing 1-6 carbon atoms, wherein at least one X is a halogen atom, a is a value between 1 and 3, b is a value between 2 and 12, and c is a value between 1 and 8, it being understood that values of b and c are based on workable ranges based on the value of a. In some cases, at least one X is F. In some cases, each X is F.

In another aspect, a method of etching etchable material from a semiconductor substrate is disclosed. The method comprises providing a substrate comprising the etchable material into a reaction chamber and providing a haloalkylamine into the reaction chamber in vapor phase for etching the etchable material. The haloalkylamine according to this aspect comprises a carbon atom bonded to a nitrogen atom, wherein the nitrogen atom is bonded to at least one halogen atom. In some embodiments, the nitrogen atom is bonded to two halogen atoms and one carbon atom. In some embodiments, the nitrogen atom is boned to two carbon atoms and one halogen atom. In some embodiments, the nitrogen atom is boned to one carbon atom and one halogen atom. In some embodiments, the haloalkylamine has a formula $R_yNX_{3-y}$, wherein X is halogen and y is 1 or 2, and wherein each R is independently selected from branched or linear C1 to C5 hydrocarbons. In some embodiments, the one or two halogen atoms are fluorine. In some embodiments, the haloalkylamine is N-fluoro-N-(1-methylethyl)-2-propanamine. In some embodiments, the haloalkylamine is selected from a group consisting of N-fluoro-N-(1-methylethyl)-2-propanamine, N-fluoro-N-methylmethanamine, N-fluoro-N-ethylethanamine, N-fluoro-N-propyl-1-propanamine, N,N-difluoromethanamine, N,N-difluoroethanamine, N,N-difluoro-1-propanamine.

General Process

In the methods according to the current disclosure, a substrate comprising the etchable material is provided into a reaction chamber. Then, haloalkylamine, such as and α-fluoroalkylamine, according to the current disclosure is provided into the reaction chamber in vapor phase for etching the etchable material. In some embodiments, the method according to the current disclosure does not include a step of forming a plasma. Thus, in some embodiments, the method according to the current disclosure is a plasma-free etch process. In some embodiments, the method does not include providing HF into a reaction chamber. Thus, the substrate is not contacted with HF during etching. In some embodiments, etching according to the current disclosure is performed by a fluoroalkylamine only. In some embodiments, the etch method comprises a continuous etch or chemical vapor etch process. In some embodiments, the etch process comprises the use of a second reactant. In some embodiments, the etch process comprises the use of one or more additional reactants.

In another aspect, the haloalkylamine provided into the reaction chamber is not an α-fluoroalkylamine. For example a haloalkylamine according to the current disclosure may comprise a carbon atom bonded to a nitrogen atom, wherein the nitrogen atom is bonded to at least one halogen atom.

In some embodiments, the current etching method is used as a part of a vapor deposition process. In some embodiments, an etch process may be carried out at one, two or more intervals in a vapor deposition process. In some embodiments an etch process may be carried out following one or more deposition cycles in a cyclic vapor deposition process. For example, an etch process may be carried out every nth deposition cycle in a cyclic vapor deposition process like an atomic layer deposition (ALD) process, where n is an integer. In some embodiments an etch process may be carried out after every cycle in a cyclic vapor deposition process such as an ALD process.

The etch process according to the current disclosure may comprise one or more cyclic phases. For example, providing a haloalkylamine and a second reactant may be repeated. In some embodiments, the process comprises or one or more acyclic phases. In some embodiments, the etch process comprises the continuous flow of at least one reactant. In some embodiments, one or more of the reactants are provided in the reaction chamber continuously. In some embodiments, the etch method according to the current disclosure comprises an atomic layer etch process.

In some embodiments, the method according to the current disclosure is a cyclic etch method. Especially in embodiments, in which a second reactant is provided into the reaction chamber, the method according to the current disclosure may be performed cyclically. Thus, in some embodiments, providing a haloalkylamine and the second reactant into the reaction chamber are performed cyclically. In some embodiments, the reaction chamber is purged between providing a haloalkylamine and providing a second reactant into the reaction chamber.

The etch process according to the current disclosure may be an atomic layer etch (ALEt) process. In ALEt thin layers of material are controllably removed using sequential reaction steps. In some embodiments the sequential reaction steps are self-limiting. In contrast to conventional continuous etching, ALEt typically utilizes a one or more etching cycles to remove material. One or more etching cycles may be provided in an ALEt process. In some embodiments, the selective etch process according to the current disclosure is a self-limiting process. Thus, in an aspect, an atomic layer etching (ALEt) method of etching etchable material from a semiconductor substrate is disclosed. The method comprises providing a substrate comprising the etchable material into a reaction chamber, providing a haloalkylamine into the reaction chamber in a vapor phase, providing a second reactant into the reaction chamber in a vapor phase to etch about a monolayer of the etchable material from the substrate. The haloalkylamine according to the current disclosure comprises a carbon atom bonded to a nitrogen atom and to at least one halogen atom.

In some embodiments, the method is a self-limiting process. Thus, the second reactant may function, for example, by oxidizing substantially one layer of molecules on the substrate surface, thereby allowing for the removal of the oxidized material from the substrate surface by a haloalkylamine according to the current disclosure. Similarly, other modifications of the topmost molecular layers may be performed before providing the etchant into the reaction chamber, to provide for the self-limiting nature of an atomic layer etch process. Thus, in some embodiments, a second reactant is provided into the reaction chamber before providing a haloalkylamine into the reaction chamber.

In some embodiments, the etchable material is silicon oxide, and the second reactant is trimethyl aluminum. In some embodiments, the etchable material is nitride, for example silicon nitride or titanium nitride, and the second reactant an oxidant, such as molecular oxygen, hydrogen peroxide or ozone. In some embodiments, in which the etchable material is a nitride, the process additionally comprises providing trimethyl aluminum into the reaction chamber as an additional vapor-phase reactant. For some nitrides such as aluminum nitride, metal β-diketonates, such as $Sn(acac)_2$ may be used as the second reactant. $Sn(acac)_2$ may also be used as the second reactant for etching aluminum oxide, vanadium oxide, zirconium oxide and hafnium oxide.

In some embodiments, the etchable material is a metal oxide, such as aluminum oxide, zinc oxide, hafnium oxide or zirconium oxide, and the second reactant is an alkyl aluminum compound, such as trimethylaluminum or dimethyl aluminum chloride. Alkyl aluminum compounds could be used in etching silicon. Certain metals and metal oxides may be etched by haloalkylamines according to the current disclosure by using a halide as the second reactant. For metallic tungsten and tungsten oxide, boron trichloride may be used as the second reactant. Boron trichloride can be used also for etching titanium oxide and gallium oxide, whereas silicon tetrachloride or titanium tetrachloride could be used in etching zirconium oxide and hafnium oxide.

In some embodiments, the method comprises at least 5 etching cycles. In some embodiments, the method comprises at least 10, or at least 50 etching cycles. In some embodiments, the method comprises at least 100 etching cycles. In some embodiments, the method comprises at least 200, or at least 300, or at least 500 etching cycles. In some embodiments, the method comprises from about 5 to about 500 etching cycles. In some embodiments, the method comprises from about 5 to about 100 etching cycles, such as from about 5 to about 50 etching cycles, or from about 10 to about 100 etching cycles, or from about 50 to about 100 etching cycles. In some embodiments, the method comprises from about 50 to about 500 etching cycles, such as from about 50 to about 200 etching cycles, or from about 100 to about 500 etching cycles. In some embodiments, the method comprises from about 200 to about 500 etching cycles.

An etching cycle may comprise a phase in which a substrate in a reaction chamber is contacted with a vapor-phase haloalkylamine according to the current disclosure. An etching cycle may comprise a phase in which a substrate in a reaction chamber is contacted with a vapor-phase second reactant according to the current disclosure. An etching cycle may comprise a phase in which a substrate in a reaction chamber is contacted with a vapor-phase haloalkylamine and a phase in which the substrate is contacted with a second reactant. In some embodiments, the haloalkylamine, the second reactant and reaction byproducts are subsequently removed from the reaction chamber by purging. In some embodiments this etching cycle can be repeated multiple times. In some embodiments an etching cycle is repeated multiple times sequentially. In some embodiments an etching cycle is repeated at intervals, for example at one, two or more intervals in another deposition process such as in a vapor deposition process.

The methods according to the current disclosure may be performed in reduced pressure. In some embodiments, a pressure within the reaction chamber is between about 1 mTorr and about 760 Torr, or about 0.5 Torr and about 30 Torr, such as about 10 Torr, about 15 Torr or about 20 Torr. In some embodiments, a pressure within the reaction chamber during the etch process according to the current disclosure is less than 500 Torr, or a pressure within the reaction chamber during the etch process is between 0.1 Torr and 500 Torr, or between 1 Torr and 100 Torr, or between 1 Torr and 20 Torr. In some embodiments, a pressure within the reaction chamber during the etch process is less than about 10 Torr, less than 50 Torr, less than 100 Torr or less than 300 Torr.

In some embodiments, a temperature within the reaction chamber is less than 250° C., less than 200° C., less than 150° C., less than 100° C., or less than 50° C. However, in embodiments in which an haloalkylamine according to the current disclosure is used to clean a reaction chamber, the temperature of the reaction chamber may be significantly higher, for example up to about 400° C. In some embodiments, a process according to the current disclosure is performed at an ambient temperature. The ambient temperature may be, for example from about 20° C. to about 30° C.

In some embodiments, the haloalkylamine is provided into the reaction chamber for a period of time between 0.01 seconds and 100 seconds. In some embodiments, the haloalkylamine may be provided into the reaction chamber repeatedly. The reaction chamber may be purged between two consecutive haloalkylamine pulses.

In some embodiments, the etchable material is etched at a rate from about 0.1 Å to about 1 Å per etch cycle, such as at a rate from about 0.1 Å to about 0.7 Å per etch cycle. In some embodiments, the etchable material is etched at a rate from about 0.1 Å to about 0.5 Å per etch cycle, or at a rate from about 0.2 Å to about 0.5 Å per etch cycle. In some embodiments, the etchable material is etched at a rate from about 0.1 Å to about 0.3 Å per etch cycle.

In some embodiments, providing a haloalkylamine and the second reactant into the reaction chamber overlap at least partially. Thus, in some embodiments, pulses of the haloalkylamine and the second reactant are not completely separate. However, in some embodiments, the haloalkylamine and the second reactant are separated from each other. This may avoid or reduce any gas-phase reactions between the haloalkylamine and the second reactant. In some embodiments, providing a haloalkylamine and the second reactant into the reaction chamber are performed alternately and sequentially.

In some embodiments, the substrate may be pretreated or cleaned prior to or at the beginning of the etch process. In some embodiments, the substrate may be subjected to a plasma cleaning process at prior to or at the beginning of the etch process. For example, in some embodiments, the substrate surface may be exposed to plasma, radicals, excited species, and/or atomic species prior to or at the beginning of the etch process according to the current disclosure. In some embodiments, the substrate surface may be exposed to hydrogen plasma, radicals, or atomic species prior to or at the beginning of the etch process. In some embodiments, a pretreatment or cleaning process may be carried out in the same reaction chamber as the current etch process. However, in some embodiments, a pretreatment or cleaning process may be carried out in a separate reaction chamber.

Purge

As used herein, the term "purge" may refer to a procedure in which vapor phase reactants and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. Purging may avoid, or at least reduce, gas-phase interactions between the two gases reacting with each other.

It shall be understood that a purge can be effected either in time or in space, or both. For example in the case of temporal purges, a purge step can be used e.g. in the temporal sequence of providing a haloalkylamine to a reaction chamber, providing a purge gas to the reaction chamber, and providing a second reactant to the reaction chamber, wherein the substrate from which a material is etched does not move. For example in the case of spatial purges, a purge step can take the following form: moving a substrate from a first location to which a haloalkylamine is continually supplied, through a purge gas curtain, to a second location to which a second reactant is continually supplied.

Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

Reaction Chamber

The reaction chamber in which a process according to the current disclosure is performed may be a part of a semiconductor processing assembly. The assembly may be a single-wafer processing assembly. Alternatively, the assembly may be a batch processing assembly. In some embodiments, the semiconductor processing assembly comprises one or more reaction chambers for depositing materials on the substrate in addition to at least one reaction chamber for etching a material from the substrate. The assembly may comprise one or more multi-station processing chambers. In such a processing chamber, each reaction station may be considered a reaction chamber. A substrate may be subjected to a number of different processing stages in addition to the etching method according to the current disclosure. Various processing stages can be performed within a single reaction chamber or they can be performed in different reaction chambers, such as reaction chambers of a cluster tool. In some embodiments, the method according to the current disclosure is performed in a single reaction chamber of a cluster tool, but other, preceding or subsequent, manufacturing steps of the structure or device are performed in additional reaction chambers of the same cluster tool. Optionally, an assembly including the current reaction chamber can be provided with a heater to activate or enhance the etching reactions by elevating the temperature of one or more of the substrate and/or the reactants.

In one aspect, a semiconductor processing assembly for etching material from a surface of a substrate is disclosed. The processing assembly according to the current disclosure comprises one or more reaction chambers constructed and arranged to hold the substrate, an injector system constructed and arranged to provide a haloalkylamine into the reaction chamber in a vapor phase and a first reactant vessel constructed and arranged to contain the haloalkylamine, wherein the haloalkylamine comprises a carbon atom bonded to a nitrogen atom and to at least one halogen atom. The processing assembly is constructed and arranged to provide the haloalkylamine via the injector system into the reaction chamber for etching the material from the substrate.

In some embodiments, the semiconductor processing assembly further comprises a second reactant vessel constructed and arranged to contain a second reactant and the injector system is constructed and arranged to provide the second reactant into the reaction chamber in a vapor phase. In some embodiments, the injector system is constructed and arranged to provide the haloalkylamine and the second reactant into the reaction chamber alternately.

Selective Etching

In some embodiments, a substrate according to the current disclosure comprises two surfaces having different material properties, and the material on the first surface is etchable material. Thus, in some embodiments, the etch process comprises a selective process. In some embodiments, the method according to the current disclosure is a selective etching method. In some embodiments, the substrate comprises a first surface and a second surface, and the first surface is selectively etched relative to the second surface. In other words, a material on the first surface is etched more rapidly than a material on the second surface. Thus, according to some aspects of the present disclosure, selective etching can be used to etch a material from a first surface of the substrate relative to a second surface of the substrate. The two surfaces have different material properties.

In some embodiments, the etchable material may be a material comprised in the substrate, or deposited on the substrate. In some embodiments, the etchable material has been deposited on the substrate on purpose. In some embodiments, the etchable material may be an unwanted contaminant on the substrate surface. For example, in some embodiments the etchable material to be etched is parasitic material grown unwantedly from an area-selective deposition process.

Selectivity in etching may be described as an etch ratio, which is the ratio of etch rate of the material on the first surface relative to the etch rate of the material on the second surface. In some embodiments, the etch selectivity of the process according to the current disclosure is about 1.5 or greater. For example, etch selectivity may be from about 1.5 to about 1,000, such as from about 1.5 to about 500, or from about 1.5 to about 200, or from about 1.5 to about 100, or from about 1.5 to about 50, or from about 1.5 to about 50, such as about 2, about 3, about 5, about 10 or about 20. In some embodiments, etch selectivity may be from about 2 to about 1,000, such as from about 5 to about 1,000, or from about 10 to about 1,000, or from about 50 to about 1,000, or from about 100 to about 1,000, or from about 500 to about 1,000. In some embodiments, etch selectivity may be from about 2 to about 500, such as from about 5 to about 500, or from about 10 to about 200, or from about 50 to about 200, or from about 20 to about 100, or from about 10 to about 100. In some embodiments, the second surface (i.e. material of the second surface) is not etched. In some embodiments, the second surface is substantially not etched. In some embodiments, the second surface is etched to a lesser extent than the first surface.

In some embodiments, the first surface is a dielectric surface. In some embodiments, the first surface is a low-k surface. In some embodiments, the first surface comprises an oxide. In some embodiments, the first surface comprises a nitride. In some embodiments, the first surface comprises silicon. Examples of silicon-comprising dielectric materials include silicon oxide-based materials, including grown or deposited silicon dioxide, doped and/or porous oxides and native oxide on silicon. In some embodiments, the first surface comprises silicon oxide. In some embodiments, the first surface is a silicon oxide surface, such as a native oxide surface, a thermal oxide surface or a chemical oxide surface. In some embodiments, the first surface comprises SiN. In some embodiments, the first surface comprises SiOC. In some embodiments, the first surface comprises metal silicates, such as aluminum silicate. Thus, the etchable material may be any of silicon oxide, SiN, SiOC or a metal silicate.

In some embodiments the first surface comprises a metal oxide, such as a high-k metal oxide. In some embodiments, the metal oxide is aluminum oxide, hafnium oxide, zirconium oxide, zinc oxide, vanadium oxide, tungsten oxide, gallium oxide or titanium oxide. Thus, in some embodiments, the etchable material is a metal oxide. In some embodiments, the etchable material on the first surface is aluminum oxide. In some embodiments, the etchable material on the first surface is zirconium oxide, hafnium oxide or lanthanum oxide. In some embodiments, the etchable material is tungsten oxide or titanium oxide. In some embodiments, a metal oxide surface is an oxidized surface of a metallic material. In some embodiments, a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments, a metal oxide surface is a native oxide formed on a metallic material. In some embodiments, the first surface comprises hydroxyl (—OH) groups.

In some embodiments, an etchable material such as silicon oxide, is selectively etched relative to a different dielectric surface. In some such embodiments, the dielectric materials have different compositions (e.g., silicon, silicon nitride, carbon, silicon oxide, silicon oxynitride, germanium oxide). In some embodiments, the first surface comprises silicon oxide, and the second surface comprises aluminum oxide ($Al_2O_3$). In some embodiments, the first surface comprises silicon oxide, and the second surface comprises silicon nitride. In some embodiments, the first surface comprises silicon oxide, and the second surface comprises silicon. In some embodiments, the second surface comprises amorphous silicon. In some embodiments, the first surface comprises $GeO_2$. In some embodiments, the first surface may comprise Ge—O bonds.

Chamber Clean

The removal of material from the sidewalls and internal parts of a reaction chamber used for deposition (i.e. deposition chamber) as part of a "chamber clean" is a standard and important part of regular maintenance of deposition hardware. The current invention is a method of chamber cleaning that is low cost, convenient, and avoids the use of plasma. Thus, in an aspect, a method of cleaning a reaction chamber of a semiconductor processing assembly is disclosed. The method comprises providing a reaction chamber having an inner surface and providing a haloalkylamine into the reaction chamber to remove material deposited on the inner surface, wherein the haloalkylamine comprises a carbon atom bonded to a nitrogen atom and to at least one halogen atom. In some embodiments of the method of cleaning a reaction chamber, the temperature of the reaction chamber is from about 100° C. to about 600° C., such as about 200° C., about 250° C. or about 400° C. In some embodiments, the method of cleaning a reaction chamber comprises providing a second reactant into the reaction chamber, and wherein the second reactant is selected from a group consisting of $O_2$, $O_3$, $H_2O_2$.

The inner surface of the reaction chamber is usually constructed of a durable material, such as stainless steel. Haloalkylamines have already been demonstrated to rapidly etch $SiO_2$ while not corroding or otherwise damaging stainless steel under similar conditions. A haloalkylamine according to the current disclosure, such as α-fluoroalkylamine, may be used for cleaning accumulated material from the inner surface without damaging the surface material. Additionally, haloalkylamines according to the current disclosure may be less hazardous to use relative to prior art methods.

The haloalkylamine is provided into the reaction chamber in a vapor phase where, for example, accumulated metal, metal oxide, or metal nitride may be removed from the parts that are internal to the reaction chamber so as to constitute a 'chamber clean'.

It is envisioned that due to the low cost, high availability, high vapor pressure, and its liquid state at room temperature, haloalkylamines can be easily introduced in the vapor phase to a reaction chamber to remove accumulated material without damage to the reaction chamber parts. In some embodiments, accumulated material, such as $SiO_2$, may be etched by a haloalkylamine alone, other materials (including oxides of other elements) may be etched by using a second reactant in addition to the haloalkylamine. The second reactant may be introduced either simultaneously or in alternated exposures into the reaction chamber.

In some embodiments, an α-fluoroalkylamine is provided into a reaction chamber to remove a metal-containing material (e.g. metal, metal oxide, or metal nitride) through continuous flow of α-fluoroalkylamine vapor through the reaction chamber. In some embodiments, the α-fluoroalkylamine is introduced intermittently. In some embodiments, a α-fluoroalkylamine is introduced alternatingly with a co-reactant such as $H_2O$, $O_2$, or $O_3$ gas. In some embodiments, a metal or metal nitride is converted by an oxidizing agent to a metal oxide that is then subsequently removed by an α-fluoroalkylamine.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

Figure 1B:
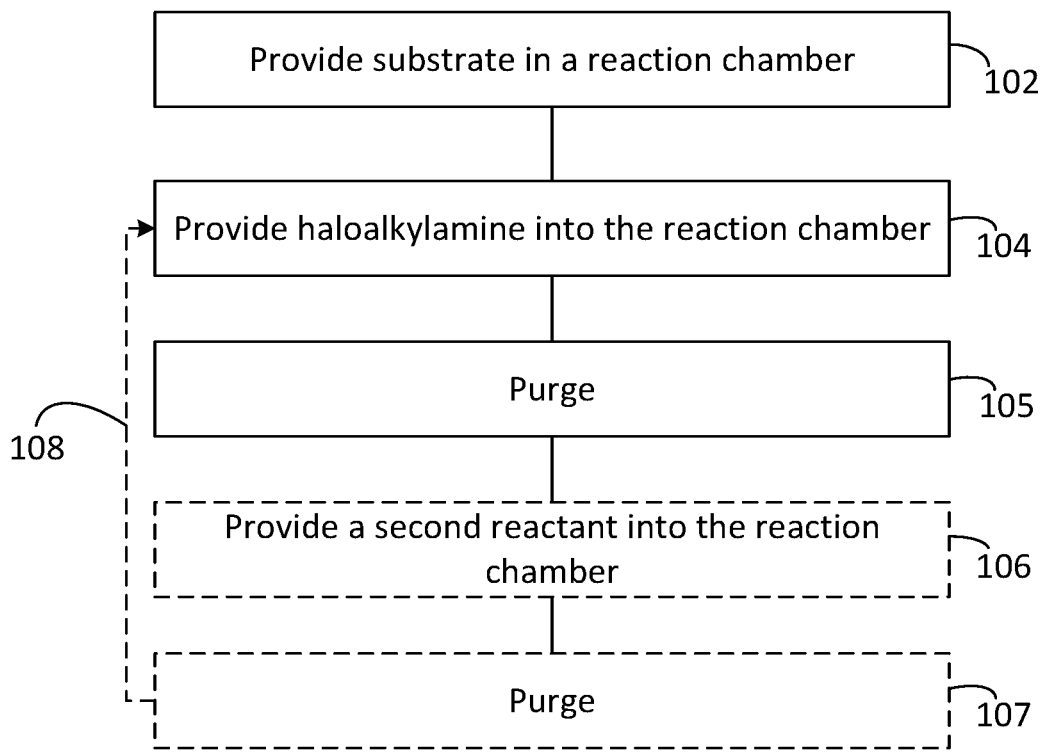

FIGS. 1A and 1B illustrate exemplary embodiments of an etch process according to the current disclosure as a block diagram. Method 100 may be used to etch a material from a substrate. The etch method 100 can be used during a formation of a semiconductor structure or device.

During step 102, a substrate is provided into a reaction chamber of a substrate processing apparatus. The reaction chamber can form part of cluster tool. In some embodiments, the substrate processing apparatus is a single-wafer processing apparatus. Alternatively, the apparatus may be a batch processing apparatus. The method 100 can be performed within a single reaction chamber or, depending on the number of phases in the process, it can be performed in multiple reaction chambers, such as reaction chambers of a cluster tool. In some embodiments, the substrate may be moved between treatment stations of a multi-station processing chamber. Such embodiments may have advantages in methods comprising both etching and deposition processes. In some embodiments, the method 100 is performed in a single reaction chamber of a cluster tool, but other, preceding or subsequent, manufacturing steps of the structure or device are performed in additional reaction chambers of the same cluster tool. The reaction chamber can be provided with a heater to activate the reactions by elevating the temperature of one or more of the substrate and/or the reactants and/or other gases.

During step 102, the substrate can be brought to a desired temperature and pressure for providing haloalkylamine into the reaction chamber (block 104) and optionally for providing a second reactant into the reaction chamber (step 106). A temperature (e.g. of a substrate or a substrate support) within a reaction chamber can be, for example, from about 20° C. to about 200° C., from about 20° C. to about 150° C., from about 20° C. to about 100° C. or from about 20° C. to about 80° C. As a further example, a temperature within a reaction chamber can be from about 30° C. to about 200° C., or from about 30° C. to about 100° C., or from about 30° C. to about 70° C., or from about 30° C. to about 55° C., or from about 40° C. to about 150° C., or from about 40° C. to about 180° C. Exemplary temperatures within the reaction chamber may be 25° C., 50° C., 55° C., 70° C., 90° C. or 95° C.

A pressure within the reaction chamber can be less than 760 Torr, for example less than 100 Torr, less than 50 Torr, less than 20 Torr, less than 5 Torr, less than 2 Torr, less than 1 Torr or less than 0.1 Torr. In some embodiments, a pressure within the reaction chamber is from about 0.01 Torr to about 80 Torr, or from about 0.01 Torr to about 50 Torr, or from about 0.01 Torr to about 20 Torr, or from about 0.01 Torr to about 10 Torr, or from about 0.01 Torr to about 5 Torr, or from about 0.01 Torr to about 1 Torr. Exemplary reaction chamber pressures include about 10 Torr, about 5 Torr, about 3 Torr or about 1 Torr, or about 0.5 Torr or about 0.1 Torr. Different pressure may be used for different process steps. In some embodiments, the pressure is the same throughout the process.

At block 104, haloalkylamine is provided into the reaction chamber to etch material from the substrate surface. The duration of providing a haloalkylamine into the reaction chamber 104 (haloalkylamine pulse time) may be, for example, from about 0.1 seconds to about 10 minutes. The haloalkylamine pulse time 104 is selected based on the reactivity of the haloalkylamine and other process conditions, such as temperature. In some embodiments, haloalkylamine pulse time is from about 1 second to about 7 minutes, or from about 2 seconds to about 4 minutes, or from about 3 seconds to about 5 minutes. In some embodiments, haloalkylamine pulse time is from about 1 second to about 3 minutes, or from about 5 seconds to about 3 minutes, or from about 10 seconds to about 3 minutes, or from about 10 seconds to about 90 seconds. In some embodiments, the haloalkylamine pulse time is longer than 5 seconds or longer than 10 seconds or longer than 30 seconds, or longer than 60 seconds. In some embodiments, the haloalkylamine pulse time is shorter than about 15 minutes or shorter than about 10 minutes or shorter than about 7 minutes, or shorter than about 5 minutes, or shorter than about 2 minutes, or shorter than about 60 seconds, or shorter than about 20 seconds.

In some embodiments, haloalkylamine is an α-fluoroalkylamine. An example of a suitable compound is N,N-diethyl-1,1,2,3,3,3-hexafluoro-1-propanamine, depicted in formula (XI). This compound may have a vapor pressure of 10 Torr at a temperature of 20° C. and a boiling point of 52° C. at 55 Torr, making it suitable for vaporizing under conditions typical of processes according to the current disclosure. The compound of formula (XI) may be capable of fluorinating at least hydroxyl and carboxylic acid groups under certain conditions. However, conditions may be defined in which N,N-diethyl-1,1,2,3,3,3-hexafluoro-1-propanamine does not react with aldehyde or ketone groups. Such properties may allow for selective etching of materials having different chemical composition or surface terminations (i.e. materials that are chemically distinct).

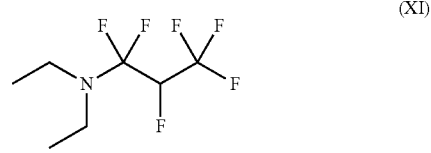

(XI)

Another example of suitable compounds includes 2,2-difluoro-1,3,-dimethylimidazolidine (DFI), depicted in formula (XII). This compound may be thermally stable until temperatures of about 150° C., and is a volatile liquid at a temperature of 25° C. (may have a vapor pressure of more than 100 Torr). DFI may have a boiling point of 47° C. at about 37 Torr, making it suitable for vaporizing under conditions typical of processes according to the current disclosure. DFI may be capable of fluorinating at least hydroxyl and carbonyl groups under certain conditions. Reactions of DFI may readily form volatile byproducts, thus making it a promising molecule for vapor-phase etching purposes. Suitable variants of DFI include, for example, 2,2-dichloro-1,3,-dimethylimidazolidine, 2,2-difluoro-1,3,-diethylimidazolidine and 2,2-difluoro-1,3,-diisopropylimidazolidine. In some embodiments, 2,2-difluoro-imidazolidine may be suitable,

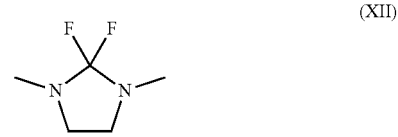

(XII)

A further example of a suitable compound is 1,1,2,2,-tetrafluoroethyl-N,N-dimethylamine (TFE), depicted in formula (XIII). TFE is liquid at room temperature, having a vapor pressure of more than 50 Torr at 25° C., and a boiling point of 32° C. at 127 Torr. Therefore, also TFE may be suitable for using in etch processes according to the current disclosure. TFE may be capable of converting at least hydroxyl groups into fluoride under certain conditions. Suitable variants of TFE include, for example, 1,1,2,2,-tetrachloroethyl-N,N-dimethylamine, 1,1,2,2,-tetrafluoroethyl-N,N-diethylamine and 1,1,2,2,-tetrafluoroethyl-N,N- diisopropylamine. In some embodiments, 2,2,-difluoroethyl-N,N-dimethylamine may be suitable.

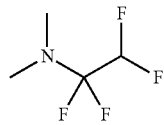

(XIII)

At block 106, a second reactant is provided into the reaction chamber containing the substrate. Block 106 is depicted with dashing to indicate that it may be excluded from some embodiments. Although depicted in FIGS. 1A and 1B after block 104 of providing a haloalkylamine into the reaction chamber, a second reactant may be provided into the reaction chamber before providing a haloalkylamine into the reaction chamber. Without limiting the current disclosure to any specific theory, the second reactant may chemisorb on the surface of the substrate during providing the second reactant into the reaction chamber. In some embodiments, the second reactant may react with the substrate surface without being chemisorbed on the substrate surface. For example, a second reactant may oxidize at least a portion of the molecules on the substrate surface. Generally, the second reactant may improve the reactivity of the surface towards the haloalkylamine used in the process. On the one hand, this may allow or improve the etching performed by the haloalkylamine. On the other hand, in atomic layer etch methods, the second reactant may allow or enhance the self-limiting nature of the ALEt process.

The duration of providing second reactant into the reaction chamber 106 (second reactant pulse time) may be, for example, from about 0.1 seconds to about 10 minutes. The duration of providing second reactant into the reaction chamber 106 is selected based on the process, tool and other factors. In some embodiments, duration of providing second reactant into the reaction chamber is from about 5 seconds to about 2 minutes, or from about 5 seconds to about 90 seconds, or from about 5 seconds to about 60 seconds. In some embodiments, duration of providing second reactant into the reaction chamber is from about 15 seconds to about 5 minutes, or from about 15 seconds to about 3 minutes, or from about 15 seconds to about 2 minutes, or from about 10 seconds to about 90 seconds. In some embodiments, the duration of providing second reactant into the reaction chamber (second reactant pulse time) is longer than 5 seconds or longer than 10 seconds or longer than 30 seconds, or longer than 60 seconds. In some embodiments, the duration of providing second reactant into the reaction chamber (second reactant pulse time) is shorter than about 15 minutes or shorter than about 10 minutes or shorter than about 5 minutes, or shorter than about 3 minutes, or shorter than about 60 seconds, or shorter than about 30 seconds.

FIG. 1B depicts an embodiment of the method according to the current disclosure comprising a purge 105 and 107. Purging may be effected temporally by alternating between reactants and purging in one reaction chamber. Purging may be effected temporally by alternating between reactants and purging in one reaction chamber. Purging may be effected spatially by moving the substrate between reaction chambers, or between treatment stations in a reaction chamber.

In embodiments, in which etching and purging are performed in one space, purge time after providing the haloalkylamine and/or second reactant pulse may be from about 0.1 seconds to about 120 seconds, or from about 0.1 seconds to about 60 seconds, or from about 0.1 seconds to about 30 seconds, or from about 0.1 seconds to about 10 seconds, or from about 0.1 seconds to about 5 seconds, or from about 0.1 seconds to about 2 seconds, or from about 0.1 seconds to about 1 second, or from about 0.1 seconds to about 0.5 seconds. In some embodiments, the purge time after second reactant is shorter than 60 seconds, shorter than 30 seconds, shorter than 10 seconds, shorter than 4 seconds, shorter than 1 seconds, or shorter than 0.5 seconds. Purging may be effected only after providing a haloalkylamine into the reaction chamber 105, only after providing a second reactant into the reaction chamber 107, or both after providing a haloalkylamine into the reaction chamber 105 and after providing a second reactant into the reaction chamber 107.

The method according to the current disclosure may be performed as a continuous etch process or as a cyclic etch process, such as ALEt. FIGS. 1A and 1B depict a loop 108, indicating an optionally cyclic embodiment of the current process. Especially in embodiments comprising using a second reactant, cyclic processes may have advantages. They may allow regulating the etching thickness through modulation of surface reactivity towards haloalkylamines.

Figure 2:
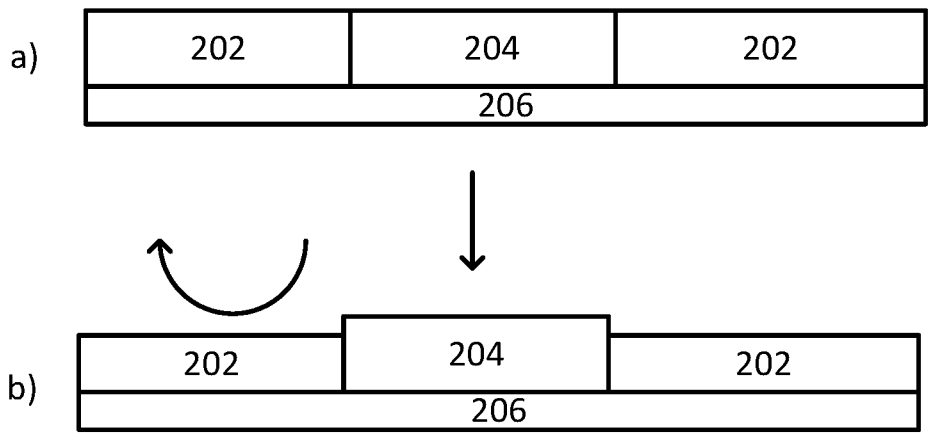
FIG. 2 is a schematic illustration of a selective etching process according to the current disclosure.

FIG. 2 illustrates an exemplary method 200 of selectively etching material from a first surface 202 of a substrate relative to a second surface 204 of the substrate.

Panel a) depicts a substrate 206 comprising a first surface 202 and a second surface 204. In the example of FIG. 2, the first surface 202 and the second surface 204 are positioned on bulk substrate material 206, but the underlying material may be other material, such as previously deposited device structures. Additionally, although the two surfaces 202, 204 are depicted to be in one plane in FIG. 2, the two surfaces may be on different vertical levels, and/or have variable topologies.

Panel b) illustrates providing a haloalkylamine into to the reaction chamber to etch the first surface (indicated with the curved arrow). Thus, a haloalkylamine, such as α-fluoroalkylamine, is contacted with the substrate, and the haloalkylamine will cause selective etching of the first surface 202. Although not indicated in the schematic illustration of FIG. 2, some material from the second surface 204 may be etched, too. However, the rate of etching of the second surface 204 is lower than that of the first surface 202. The difference in the etching rate between first surface 202 and second surface 204 depends on the process parameters and materials used. In some embodiments, the first surface 202 comprises, consists essentially of, or consists of silicon oxide, and the second surface 204 comprises, consists essentially of, or consists of silicon nitride. In some embodiments, the first surface 202 comprises, consists essentially of, or consists of silicon oxide, and the second surface 204 comprises, consists essentially of, or consists of a metal oxide, such as aluminum oxide.

In a non-limiting example, a silicon oxide surface may be selectively etched relative to a silicon nitride surface. The substrate temperature may be kept at below about 150° C., while the reactant source may be kept at ambient temperature, or at a temperature of below 50° C. The pressure in the reaction chamber may be from 0.01 Torr to about 350 Torr during the process. Haloalkylamine may be provided into the reaction chamber from about 30 seconds to about 5 minutes. Haloalkylamine may be provided into the reaction chamber as a continuous flow. Alternatively, haloalkylamine may be provided into the reaction chamber in two or more pulses, optionally having a purge in between.

Figure 3:
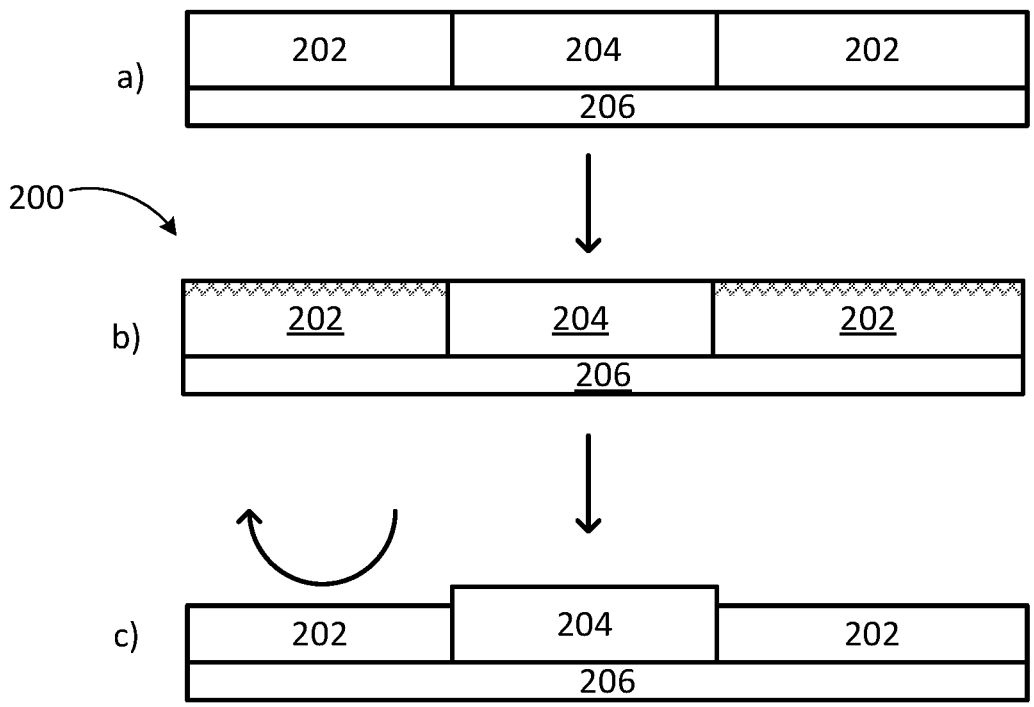
FIG. 3 is a schematic illustration of another embodiment of a selective etching process according to the current disclosure.

FIG. 3 depicts another exemplary method 200 of selectively etching material from a first surface 202 of a substrate relative to a second surface 204 of the substrate. Panel a) depicts a substrate 206 similar to the example of FIG. 2.

Panel b) illustrates the substrate of panel a) after providing a second reactant into to the reaction chamber to modify the first surface (cross-hatching). The depth of the modification depends on the treatment and the properties of the surface, and is not drawn to scale. The degree of modification may be reduced along the depth of the first material. However, in some embodiments, the modification extends substantially uniformly to a given depth of the first material. In some embodiments, substantially only the topmost atom or molecular layer of the first surface is modified.

In panel c), a haloalkylamine, such as α-fluoroalkylamine, is contacted with the substrate, and the haloalkylamine will cause selective etching of the first surface 202 (indicated again with the curved arrow) similarly to the embodiment of FIG. 2.

Figure 4:
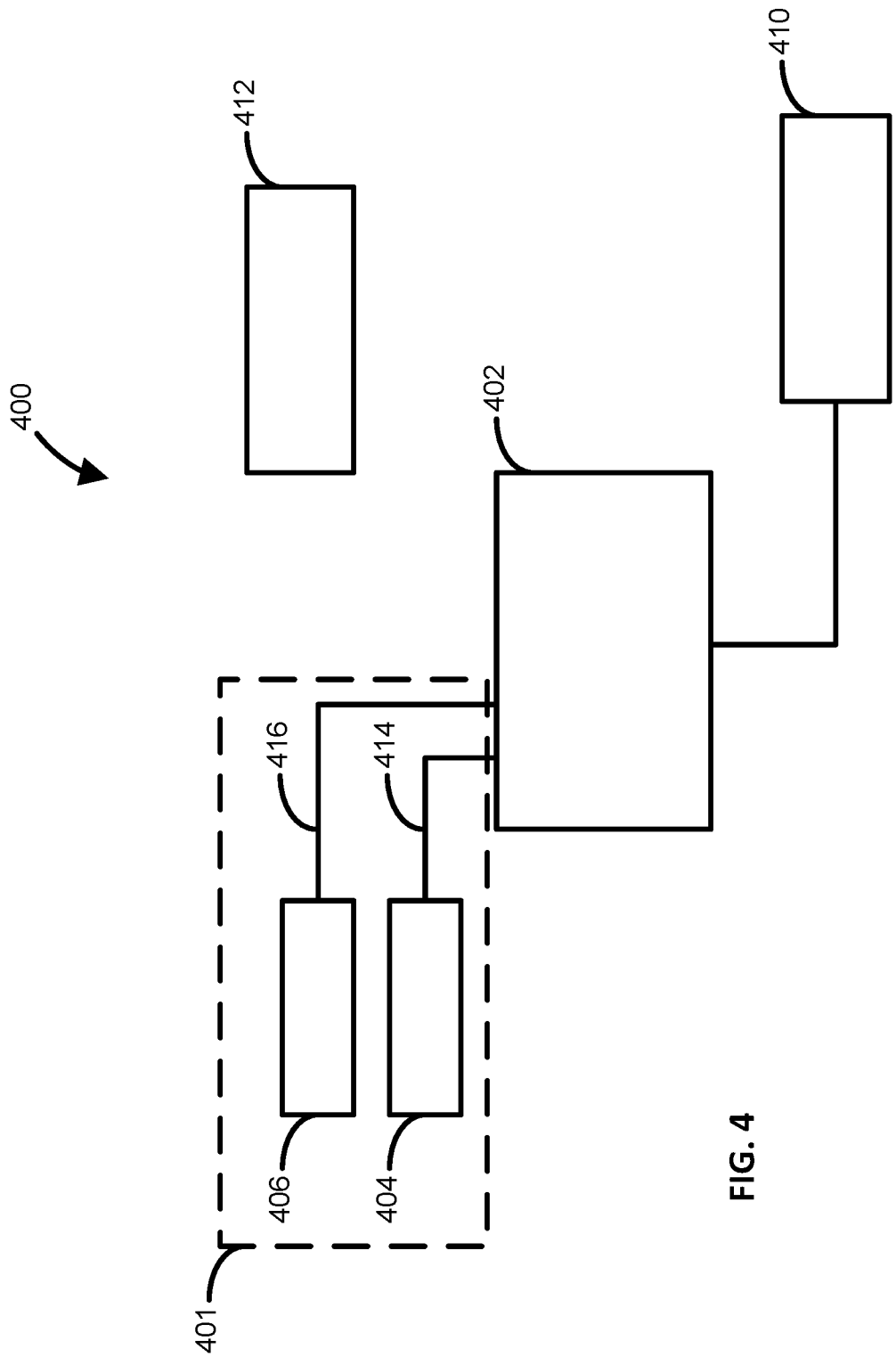
FIG. 4 presents a semiconductor processing assembly according to the current disclosure schematically.

FIG. 4 illustrates a semiconductor processing assembly 400 according to the current disclosure in a schematic manner. Semiconductor processing assembly 400 can be used to perform a method as described herein to form a layer, a structure or a device, or a portion thereof.

In the illustrated example, semiconductor processing assembly 400 includes one or more reaction chambers 402, a reactant injector system 401, a haloalkylamine source vessel 404, an optional second reactant source vessel 406, an exhaust source 410, and a controller 412. The semiconductor processing assembly 400 may comprise one or more additional gas sources (not shown), such as an inert gas source, a carrier gas source and/or a purge gas source. Also, in case materials are deposited in the same reaction chamber, the semiconductor processing assembly may further comprise additional precursor and/or reactant vessels.

Reaction chamber 402 can include any suitable reaction chamber. In some embodiments, the reaction chamber is constructed and arranged to perform an ALEt process. Especially in embodiments, in which an haloalkylamine is used to clean a reaction chamber, the reaction chamber may be a vapor deposition chamber, such as an ALD or a CVD reaction chamber.

The haloalkylamine source vessel 404 can include a vessel and a haloalkylamine as described herein—alone or mixed with one or more carrier (e.g., inert) gases. A second reactant source vessel 406 can include a vessel and a second reactant as described herein—alone or mixed with one or more carrier gases. Although illustrated with two source vessels 404 and 406, semiconductor processing assembly 400 can include any suitable number of source vessels. Source vessels 404 and 406 can be coupled to reaction chamber 402 via lines 414 and 416, which can each include flow controllers, valves, heaters, and the like. In some embodiments, the haloalkylamine in the haloalkylamine source vessel 404 and/or the second reactant in the second reactant source vessel 406 may be heated.

Exhaust source 410 can include one or more vacuum pumps.

Controller 412 includes electronic circuitry and software to selectively operate valves, manifolds, heaters, pumps and other components included in the semiconductor processing assembly 400. Such circuitry and components operate to introduce reactants, reactants and purge gases from the respective sources. Controller 412 can control timing of gas pulse sequences, temperature of the substrate and/or reaction chamber 402, pressure within the reaction chamber 402, and various other operations to provide proper operation of the semiconductor processing assembly 400. Controller 412 can include control software to electrically or pneumatically control valves to control flow of reactants, reactants and purge gases into and out of the reaction chamber 402. Controller 412 can include modules such as a software or hardware component, which performs certain tasks. A module may be configured to reside on the addressable storage medium of the control system and be configured to execute one or more processes.

Other configurations of semiconductor processing assembly 400 are possible, including different numbers and kinds of reactants and reactant sources. Further, it will be appreciated that there are many arrangements of valves, conduits, reactant sources, and auxiliary reactant sources that may be used to accomplish the goal of selectively and in coordinated manner feeding gases into reaction chamber 402. Further, as a schematic representation of a semiconductor processing assembly, many components have been omitted for simplicity of illustration, and such components may include, for example, various valves, manifolds, purifiers, heaters, containers, vents, and/or bypasses.

During operation of semiconductor processing assembly 400, substrates, such as semiconductor wafers (not illustrated), are transferred from, e.g., a substrate handling system to reaction chamber 402. Once substrate(s) are transferred to reaction chamber 402, one or more gases from gas sources, such as reactants, reactants, reducing agents, carrier gases, and/or purge gases, are introduced into reaction chamber 402.

Various modifications of the disclosure, in addition to those shown and described above, such as alternative useful combinations of the elements described, may become apparent to those skilled in the art from the description. Such modifications and embodiments are also intended to fall within the scope of the appended claims.

The invention claimed is:

1. A method of etching etchable material from a semiconductor substrate, wherein the method comprises:
providing a semiconductor substrate comprising the etchable material into a reaction chamber; and
providing a haloalkylamine into the reaction chamber in vapor phase for etching the etchable material, wherein the haloalkylamine comprises a carbon atom bonded to a nitrogen atom and to at least one halogen atom and is selected from the group consisting of N,N-diethyl-1,1,2,3,3,3-hexafluoro-1-propanamine, 2,2-difluoro-1,3,-dimethylimidazolidine, 2,2-dichloro-1,3,-dimethylimidazolidine, 2,2-difluoro-1,3,-diethylimidazolidine, 2,2-difluoro-1,3,-diisopropylimidazolidine, 2,2-difluoroimidazolidine, 1,1,2,2,-tetrafluoroethyl-N,N-dimethylamine, 1,1,2,2,-tetrachloroethyl-N,N-dimethylamine, 1,1,2,2,-tetrafluoroethyl-N,N-diethylamine, 1,1,2,2,-tetrafluoroethyl-N,N-diisopropylamine, and 2-chloro-N,N-diethyl-1,1,2-trifluoroethanamine,
or
the haloalkylamine is 2,2,-difluoroethyl-N,N-dimethylamine.

2. The method of claim 1, wherein the carbon atom is bonded to two halogen atoms and the haloalkylamine is selected from the group consisting of 2,2-difluoro-1,3,-dimethylimidazolidine, 2,2-dichloro-1,3,-dimethylimidazolidine, 2,2-difluoro-1,3,-diethylimidazolidine, 2,2-difluoro-1,3,-diisopropylimidazolidine, and 2,2-difluoroimidazolidine.

3. The method of claim 1, wherein the at least one halogen atom is chlorine, and the haloalkylamine is selected from the group consisting of 2,2-dichloro-1,3,-dimethylimidazolidine and 1,1,2,2,-tetrachloroethyl-N,N-dimethylamine.

4. The method of claim 1, wherein the halogen atom is fluorine and the haloalkylamine is selected from the group consisting of N,N-diethyl-1,1,2,3,3,3-hexafluoro-1-propanamine, 2,2-difluoro-1,3,-dimethylimidazolidine, 2,2-difluoro-1,3,-diethylimidazolidine, 2,2-difluoro-1,3,-diisopropylimidazolidine, 2,2-difluoro-imidazolidine, 1,1,2,2,-tetrafluoroethyl-N,N-dimethylamine, 1,1,2,2,-tetrafluoroethyl-N,N-diethylamine, 1,1,2,2,-tetrafluoroethyl-N,N-diisopropylamine, 2,2-difluoroethyl-N,N-dimethylamine and 2-chloro-N,N-diethyl-1,1,2-trifluoroethanamine.

5. The method of claim 1, wherein the carbon atom is bonded to two fluorine atoms and the haloalkylamine is selected from the group consisting of 2,2-difluoro-1,3,-dimethylimidazolidine,2,2-difluoro-1,3,-diethylimidazolidine, 2,2-difluoro-1,3,-diisopropylimidazolidine, and 2,2-difluoro-imidazolidine.

6. The method of claim 1, wherein the haloalkylamine is selected from the group consisting of 2,2-difluoro-1,3,-dimethylimidazolidine, 2,2-dichloro-1,3,-dimethylimidazolidine, 2,2-difluoro-1,3,-diethylimidazolidine, 2,2-difluoro-1,3,-diisopropylimidazolidine, and 2,2-difluoro-imidazolidine.

7. The method of claim 1, wherein the method comprises providing a second reactant into the reaction chamber.

8. The method of claim 7, wherein the second reactant is an oxygen-containing reactant selected from the group consisting of $O_2$, $O_3$, $H_2O_2$ and carboxylic acids.

9. The method of claim 7, wherein the second reactant is a halide.

10. The method of claim 9, wherein the halide is selected from the group consisting of $BCl_3$, $SiCl_4$ and $TiCl_4$.

11. The method of claim 7, wherein the second reactant is an organometallic compound.

12. The method of claim 7, wherein providing the haloalkylamine and the second reactant into the reaction chamber are performed alternately and sequentially.

13. The method of claim 1, wherein the method is a cyclic etch method.

14. The method of claim 1, wherein the method is a self-limiting process.

15. The method of claim 1, wherein the etchable material comprises silicon or germanium.

16. The method of claim 1, wherein the semiconductor substrate comprises a first surface and a second surface, and the first surface is selectively etched relative to the second surface.

17. An atomic layer etching method of etching etchable material from a semiconductor substrate, the method comprising:
providing a semiconductor substrate comprising the etchable material into a reaction chamber;
providing a haloalkylamine into the reaction chamber in a vapor phase; and
providing a second reactant into the reaction chamber in a vapor phase to etch about a monolayer of the etchable material from the substrate,
wherein the haloalkylamine comprises a carbon atom bonded to a nitrogen atom and to at least one halogen atom and is selected from the group consisting of N,N-diethyl-1,1,2,3,3,3-hexafluoro-1-propanamine, 2,2-difluoro-1,3,-dimethylimidazolidine, 2,2-dichloro-1,3,-dimethylimidazolidine, 2,2-difluoro-1,3,-diethylimidazolidine, 2,2-difluoro-1,3,-diisopropylimidazolidine, 2,2-difluoro-imidazolidine, 1,1,2,2,-tetrafluoroethyl-N,N-dimethylamine, 1,1,2,2,-tetrachloroethyl-N,N-dimethylamine, 1,1,2,2,-tetrafluoroethyl-N,N-diethylamine, 1,1,2,2,-tetrafluoroethyl-N,N-diisopropylamine, and 2-chloro-N,N-diethyl-1,1,2-trifluoroethanamine,
or
the haloalkylamine is 2,2,-difluoroethyl-N,N-dimethylamine.

18. The method of claim 17, wherein the method is a self-limiting process.

19. A method of etching etchable material from a semiconductor substrate, wherein the method comprises:
providing a semiconductor substrate comprising the etchable material into a reaction chamber; and
providing a haloalkylamine into the reaction chamber in vapor phase for etching the etchable material, wherein the haloalkylamine comprises a carbon atom bonded to a nitrogen atom and the nitrogen atom is bonded to at least one halogen atom and is selected from the group consisting of N-fluoro-N-(1-methylethyl)-2-propanamine, N-fluoro-N-methylmethanamine, N-fluoro-N-ethylethanamine, N-fluoro-N-propyl-1-propanamine, N,N-difluoromethanamine, N,N-difluoroethanamine, and N,N-difluoro-1-propanamine.

20. The method of claim 19, wherein the haloalkylamine is N-fluoro-N-(1-methylethyl)-2-propanamine.

* * * * *